310-322 SR
8/11/81 XR 4,283,649

United States Patent [19] [11] 4,283,649
Heinouchi [45] Aug. 11, 1981

[54] PIEZOELECTRIC ULTRASONIC TRANSDUCER WITH RESONATOR LAMINATE

[75] Inventor: Yoshiaki Heinouchi, Joyo, Japan

[73] Assignee: Murata Manufacturing Co., Ltd., Japan

[21] Appl. No.: 75,275

[22] Filed: Sep. 13, 1979

[30] Foreign Application Priority Data

| | | | |
|---|---|---|---|
| Sep. 21, 1978 | [JP] | Japan | 53-130524[U] |
| Sep. 21, 1978 | [JP] | Japan | 53-130525[U] |
| Sep. 21, 1978 | [JP] | Japan | 53-130526[U] |
| Sep. 28, 1978 | [JP] | Japan | 53-133820[U] |
| Oct. 11, 1978 | [JP] | Japan | 53-139803[U] |

[51] Int. Cl.$^3$ .......... H01L 41/08

[52] U.S. Cl. .......... 310/324; 310/322; 310/345; 179/110A

[58] Field of Search .......... 310/345, 326, 327, 321, 310/322, 324; 179/110 A

[56] References Cited

U.S. PATENT DOCUMENTS 3,675,053 7/1972 Mifune .......... 310/322

FOREIGN PATENT DOCUMENTS 2547606 5/1976 Fed. Rep. of Germany ...... 179/110 A

*Primary Examiner*—Mark O. Budd

[57] ABSTRACT

An ultrasonic transducer comprises a composite vibrator, which comprises a bimorph vibrator and a resin made additional resonator of a frustum of a cone provided at the central portion of the bimorph vibrator. The composite vibrator gives rise to the first resonance by a piston vibration mode at the lower frequency region and the second resonance by a bending vibration mode at the higher frequency region as compared with the central frequency. The composite vibrator is fixed to an insulating base through a ring shaped elastic member, whereby a resonance characteristic by virtue of a piston vibration mode is enhanced. Preferably a protrusion of the diameter slightly smaller than the nodal circle by virtue of a bending vibration mode is formed on the transducing surface of the resin made additional resonator of a frustum of a cone. The protrusion serves to reduce the quality factor of the second resonance by virtue of a bending vibration mode.

11 Claims, 23 Drawing Figures

PIEZOELECTRIC ULTRASONIC TRANSDUCER WITH RESONATOR LAMINATE

BACKGROUND OF THE INVENTION

1. Field of the Invention

The present invention relates to an ultrasonic transducer. More specifically, the present invention relates to an ultrasonic transducer for use with a vicinity alarm utilizing a Doppler effect, a remote control apparatus for a television receiver, and the like.

2. Description of the Prior Art

Typically an ultrasonic transducer for use in a vicinity alarm utilizing a Doppler effect, a remote control apparatus for a television receiver, and the like employs a composite vibrator including an aluminum or a resin resonator provided at the central portion of one surface of a ceramic bimorph vibrator. Such an ultrasonic transducer is desclosed in U.S. Pat. No. 3,675,053 issued July 4, 1972 and British Pat. No. 1,514,967 issued June 21, 1978, for example. The former referenced patent is of a single peak frequency characteristic and accordingly exhibits a relatively narrow utilizable frequency band. On the other hand, the latter referenced patent is of a double humped frequency characteristic and hence exhibits a relatively wide utilizable frequency band.

The present invention is directed to an improvement in an ultrasonic transducer having a double humped frequency characteristic as shown in the latter referenced British Pat. No. 1,514,967.

FIG. 1 shows a sectional view of an example of a conventional ultrasonic transducer. The transducer shown includes a composite vibrator 1 which comprises a resin resonator 3 in the shape of a frustum of a cone fixed in the vicinity of the center of one surface of a ceramic bimorph resonator 2. The composite vibrator 1 is disposed such that the bimorph vibrator 2 is fixed to an insulating base 4 by means of a cylindrical supporting member 41 formed integrally with the insulating base 4. External connection terminals 91 and 92 are provided through the base 4 and are electrically connected to the corresponding layers of the bimorph vibrator 2 by means of lead wires *2a* and *2b*, respectively. The base 4 as well as the composite vibrator 1 is covered with a metallic casing 6. The casing 6 is formed with an opening 61 at the top surface thereof for emitting outward of the casing ultrasonic energy generated by the composite vibrator 1 or receiving ultrasonic energy from the environment. The opening 61 is covered with a screen member 7. The screen member 7 is sandwiched in the casing 6 between an edge 62 of the opening of the casing and a ring member 8, with the ring member 8 supported by an annular shelf 63 in the casing 6. The shelf 63 may be formed by protruding inward the peripheral side surface of the casing by a drawing process, for example. A shield plate 5 is provided such that the same is fixed by caulking as at the end 64 of the casing 6. The metallic casing 6 and the shield plate 5 are to electrostatically shield the composite vibrator 1.

FIG. 2 is a graph showing an impedance characteristic typical of the FIG. 1 ultrasonic transducer. FIG. 3 is a graph showing a sensitivity characteristic typical of the FIG. 1 ultrasonic transducer. As seen from FIG. 2, such an ultrasonic transducer as shown in FIG. 1 gives rise to the first resonance region at the lower frequency region exhibiting the first sensitivity and the second resonance region at the higher frequency region exhibiting the second sensitivity. As a result of experimentation by placing powder on the transducing surface of the resin resonator 3, it has been observed that the first resonance region and the second resonance region are based on different vibration modes. More specifically, the first resonance region is observed as vibration of an up and down vibration mode or "a piston vibration mode" wherein powder distributed on the transducing surface is vibrated up and down throughout the whole surface thereof. On the other hand, the second resonance region is observed as vibration of a bending vibration mode, inasmuch as the powder distributed on the transducing surface is concentrated along the nodal line. Nevertheless, as seen from FIG. 3, the sensitivity level at the first resonance region is considerably lower than the sensitivity level at the second resonance region. Referring to FIG. 3, a practically utilizable sensitivity level for such an ultrasonic transducer is shown by broken line A. As seen from FIG. 3, the sensitivity level of the first resonance is not sufficiently large to exceed the practically utilizable sensitivity level A, with the result that an ultrasonic wave can hardly be transduced in the relatively low frequency region with such low sensitivity level. Accordingly, a conventional ultrasonic transducer as shown in FIG. 1 can merely provide a narrow frequency range B as shown in FIG. 3 where only the second resonance region occurs. The low sensitivity level of the first resonance region may be accounted for as follows; since the composite vibrator 1 is directly fixed to the base 4 by means of the cylindrical supporting member 41, the vibration in the piston vibration mode is suppressed, with the result that the sensitivity at the first resonance region is low.

SUMMARY OF INVENTION

Briefly described, the present invention comprises an ultrasonic transducer, wherein a composite vibrator is disposed on an insulating base in an elastic manner.

According to the present invention, resonance in a piston vibration mode of a composite vibrator is caused smoothly, whereby the sensitivity level of the first resonance region is increased. Accordingly, a high sensitivity level can be maintained over a very wide frequency range, in cooperation with the sensitivity level of the second resonance region at a bending vibration mode. As a result, an ultrasonic transducer of a very wide frequency band can be obtained.

In a preferred embodiment of the present invention, a protrusion is formed on the transducing surface of a resin resonator constituting part of a composite vibrator. The protrusion serves to decrease the quality factor of the resonance in the bending vibration mode, i.e. the second resonance region, thereby to make balanced the sensitivity level of the first resonance region and the sensitivity level of the second resonance region.

In a further preferred embodiment of the present invention, an insulating base is configured as a bottomed cylindrical shape. The base is formed of a cylindrical post supporting portion extending from the bottom toward the opening end, and a composite vibrator is fixed to the tip end of the supporting portion by means of an elastic member. The inner peripheral surface of the bottomed cylindrical base is formed stepwise such that the inner diameter thereof is increased toward the opening, whereby the transducing efficiency of the ultrasonic transducer is improved.

Accordingly, a principal object of the present invention is to provide an ultrasonic transducer having a wide band frequency characteristic.

Another object of the present invention is to provide an ultrasonic transducer having an improved structure.

A further object of the present invention is to provide an ultrasonic transducer including a composite vibrator, wherein the resonance region in the piston vibration mode is caused smoothly.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
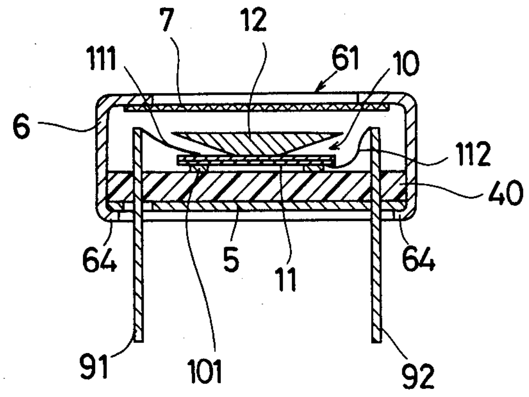
FIG. 4 is a sectional view showing one embodiment of the present invention.
Figure 5:
FIG. 5 is a perspective view of a resin resonator in the shape of a frustum of a cone for use in the present invention.
Figure 6:
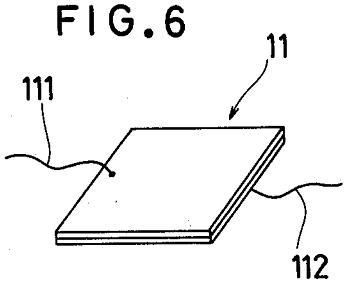
FIG. 6 is a perspective view showing an example of a square shaped piezoelectric ceramic bimorph vibrator for use in the present invention.
Figure 7:
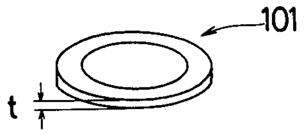
FIG. 7 is a perspective view showing an example of a ring shaped elastic member for use in the present invention.

FIG. 4 is a sectional view showing one embodiment of the present invention. A composite vibrator 10 comprises a resin resonator 12 fixed by an adhesive agent to the central portion of one surface of a square shaped piezoelectric ceramic bimorph vibrator 11. The bimorph vibrator 11 comprises two piezoelectric ceramic plates adhered to each other, as shown in FIG. 6, with leads 111 and 112 solder connected to outer side electrodes, not shown, at a nodal line. The additional resonator 12 is configured as the frustum of a cone, as shown in FIG. 5, and the surface of the smaller base of the frustum (the lower surface as viewed in FIG. 5) is fixed to the bimorph vibrator 11, while the base having the larger diameter (the upper surface as viewed in FIG. 5) serves as a transducing surface. The composite vibrator 10 is fixed by means of a ring shaped elastic member 101 made of silicon rubber as shown in FIG. 7 to an insulating base 40 through which external connection pins 91 and 92 penetrate and are fixed. Preferably, the composite vibrator 10, particularly the bimorph vibrator 11, and the elastic member 101, and the base 40 are fixed by means of a silicon adhesive agent, for example. A shield plate 5 is provided on the rear surface or the outer surface of the base 40, being solder connected to one pin 92 and electrically isolated from the other pin 91. A cylindrical metallic casing 6 is provided with a screen member 7 at one opening 61 of the casing 6. The casing 6 is fixed to the base 40 so as to surround the composite vibrator 10, with the end of the casing 6 caulked to the base 40.

Figure 8:
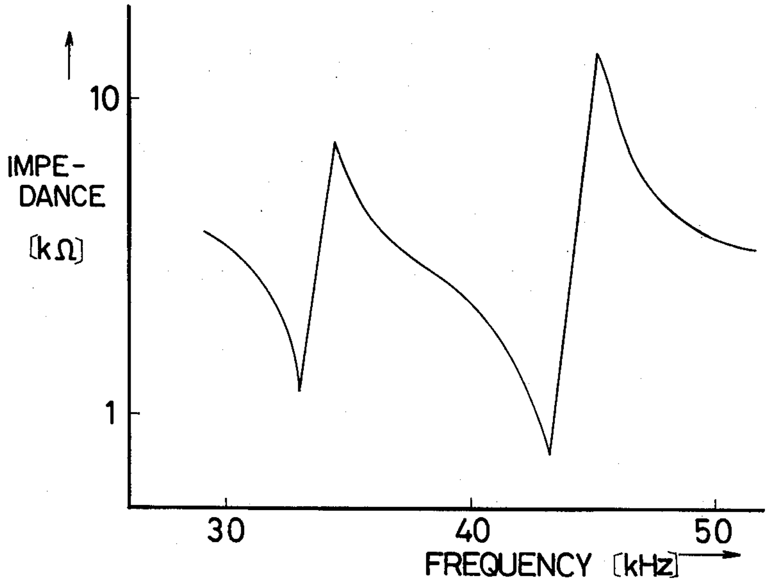
FIG. 8 is a graph showing an impedance characteristic typical of the FIG. 4 embodiment.
Figure 9:
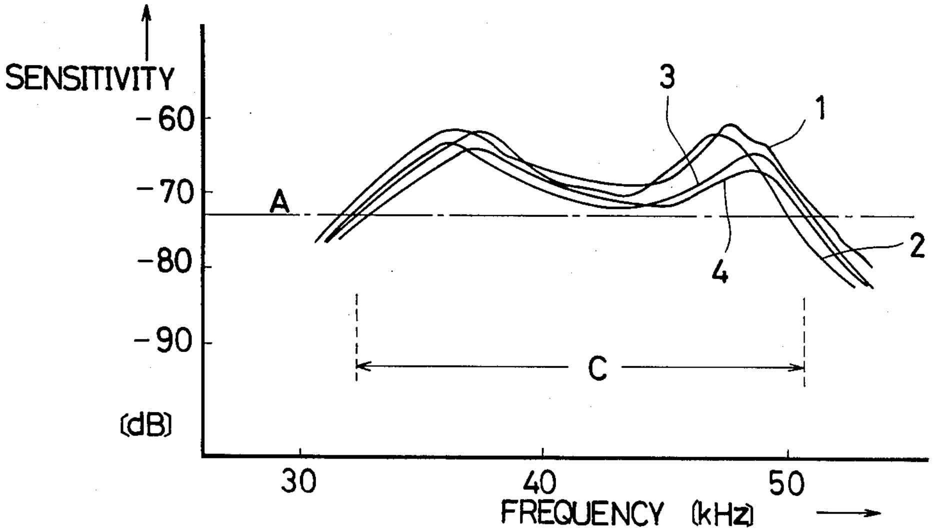
FIG. 9 is a graph showing a sensitivity characteristic typical of the FIG. 4 embodiment, with the thickness of the elastic member as a parameter.

According to the FIG. 4 embodiment, since the composite vibrator 10 is supported by means of the elastic member 101, vibration in a piston vibration mode is the more efficiently caused among two vibration modes of such composite vibrator 10. Accordingly, an ultrasonic transducer can be provided wherein an impedance characteristic as shown in FIG. 8 is exhibited and a sensitivity characteristic as shown in FIG. 9 is exhibited, with a practically utilizable large sensitivity level attained in the lower frequency region. Thus an ultrasonic transducer of a good sensitivity over a wide frequency band is provided by virtue of an enhanced sensitivity level at the first resonance region of the piston vibration mode, in cooperation with the second resonance region of the bending vibration mode that originally had a sufficiently high sensitivity level. The frequency band where a practically utilizable sensitivity level is available is shown by the range C in FIG. 9. Referring to FIG. 9, it is seen that the practically utilizable frequency band has been considerably broadened as compared with a conventional ultrasonic transducer. Referring to FIG. 9, the characteristic curves denoted as a, b, c and d exhibit the sensitivity, with the thickness t of the ring shaped elastic member 101 (FIG. 7) (i.e. the spacing between the bimorph vibrator 11 and the insulating base 40) as a parameter. Thus, the curve a shows a sensitivity characteristic in case where $t=0.2$ mm, the curve b exhibits a sensitivity characteristic in the case where $t=0.4$ mm, the curve c exhibits a sensitivity characteristic in the case where $t=0.6$ mm, and the curve d exhibits a sensitivity characteristic in the case where $t=0.8$ mm. Although the experimental result reveals that the thickness $t=0.2$ mm of the elastic member 101 is the optimum in the transducer used in the experiment, the optimum thickness t could be changed by virtue of the geometery of the composite vibrator 10 and should be preferably determined experimentally. The above described characteristic curves are those obtained using the transducer with the metallic casing 6 removed and the sensitivity is more or less decreased when the casing 6 as shown in FIG. 4 is in place; however, the sensitivity may be enhanced by elaborating the geometry of the casing, or the base, or the additional resonator. Thus, the geometry and configuration of the casing and the like may be suitably determined in consideration of the applications.

Figure 10:
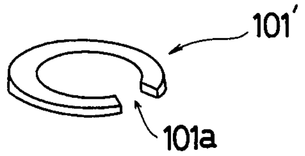
FIG. 10 is a perspective view showing another example of a ring shaped elastic member.
Figure 2:
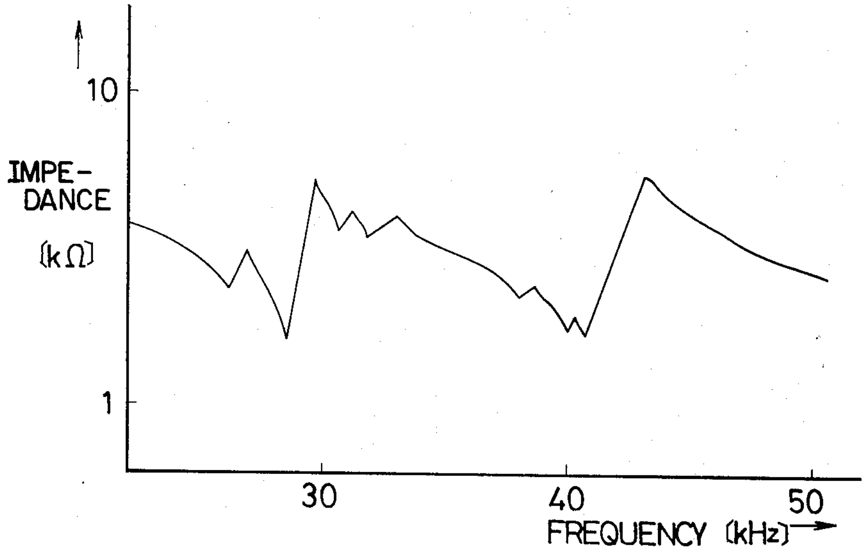
FIG. 2 PRIOR ART
FIG. 2 is a graph showing an impedance characteristic typical of the FIG. 1 ultrasonic transducer.
Figure 3:
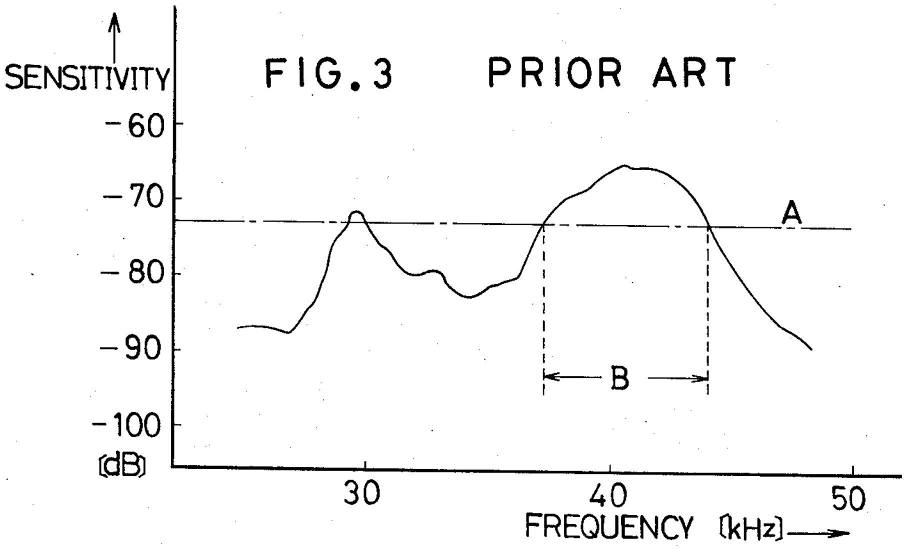
FIG. 3 PRIOR ART
FIG. 3 is a graph showing a sensitivity characteristic typical of the FIG. 1 ultrasonic transducer.

Although in the above described embodiment a ring shaped silicon rubber was employed as the elastic member 101, the present invention is not limited thereto and alternatively the composite vibrator may be directly fixed by means of a silicon adhesive agent. Alternatively, a split ring shaped silicon rubber 101' as shown in FIG. 10 may be utilized in place of the above described ring shaped silicon rubber 101. If and when the split ring shaped silicon rubber 101' is employed, a solder connected portion of the lead 112 of the bimorph vibrator 11 may be positioned at the split portion 101*a*, whereby a desired directivity of the composite vibrator 10 can be assuredly achieved without the composite vibrator 10 being inclined by such solder connecting portion.

Figure 11:
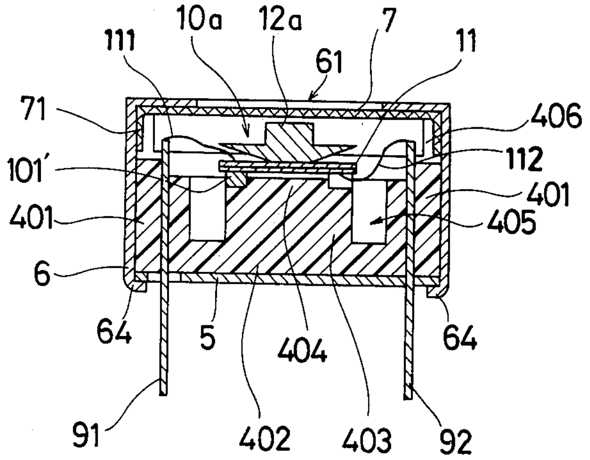
FIG. 11 is a sectional view showing another embodiment of the present invention.
Figure 12:
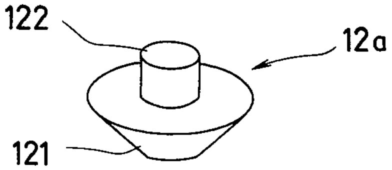
FIG. 12 is a perspective view showing an example of a resin resonator for use in the FIG. 11 embodiment.
Figure 13:
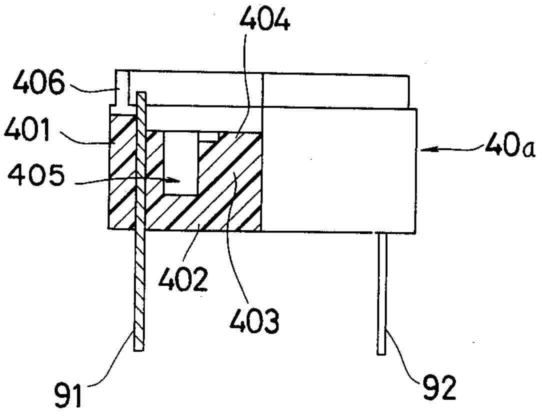
FIG. 13 is a side view, partially in section, of a base for use in the FIG. 11 embodiment.

FIG. 11 is a sectional view showing another embodiment of the present invention. Since the major portion of the FIG. 11 embodiment is similar to that of the FIG. 4 embodiment, the portion of the FIG. 11 embodiment different from the FIG. 4 embodiment will be mainly described in the following. The additional resonator 12*a* is configured to comprise a main body 121 (FIG. 12) of a frustum having the shape of the cone and a cylindrical protrusion 122 formed integrally on the main body 121 on the transducing base, i.e. the surface of the frustum having the larger diameter. The base having the smaller diameter is fixed to the bimorph vibrator 11. An insulating base has also been differently structured as compared with the FIG. 4 embodiment. More specifically, the base 40*a* is configured as a bottomed cylindrical shape to comprise a peripheral wall 401 and a bottom 402. A supporting member 403 is formed as a cylindrical post within the base 40*a* to extend from the center of the bottom 402 upward in the axial directin, whereby a peripheral groove 405 is formed between the supporting member 403 and the peripheral wall 401. The supporting member 403 is provided, at the upper end surface at the open side of base 40*a*, with a protrusion 404 having an outer diameter smaller than the outer diameter of the supporting member 403 disposed in a concentric manner. The inner peripheral surface of the peripheral wall 41 of the base 40*a* is formed stepwise, such that the inner diameter of the peripheral wall 401 is increased in succesesion and thus the opening of the base 40*a* is broadened from the bottom toward the opening end, with a plurality of offsets formed in the inner peripheral surface of the peripheral wall 401. The base peripheral wall 401 is also formed with an offset at the outer peripheral surface in the vicinity of the open end, whereby a protuberance 406 is formed. Outer connection pins 91 and 92 are embedded in the base peripheral wall 401. A split ring shaped elastic member 101', as shown in FIG. 10, made of silicon rubber, for example, is fitted to the protrusion 404. The elastic member 101' is formed thicker than the height of the protrusion 404, so that, when the same is fitted to the protrusion 404, a space is formed between the upper surface of the elastic member 101' and the upper surface of the protrusion 404. The protrusion 404 is to fix the elastic member 101' by fitting the ring shaped elastic member 101' to the tip end thereof. With such protrusion 404 thus formed, the elastic member 101' may be simply fitted to the protrusion 404 and may be adhered as desired, which enables assured positioning of the elastic member 101' and thus positioning of the composite vibrator 10*a* with simplicity.

Alternatively, a protuberance, not shown, may be provided around the protrusion 404 at the end surface of the supporting member 403, thereby to enable fitting of the elastic member 101' in a peripheral groove, not shown, to be thus formed between the protuberance and the protrusion 404.

Preferably, the elastic member 101' may be fixed by filling a silicon adhesive agent between the elastic member 101' and the supporting member 403. The composite vibrator 10*a* is fixed on the elastic member 101' by means of a silicon adhesive agent, with the transducing surface including the surface of the protrusion 122 of the composite vibrator 10*a* facing the opening 61 of the casing 6. The vibrator 10*a* is fixed by positioning a solder connecting portion of the lead 112 of the lower surface of the bimorph vibrator 11 at the split portion 101*a* (FIG. 10) of the elastic member 101'. Then preferably the split portion 101*a* is fully filled with a silicon adhesive agent, such that a gap between the bimorph vibrator 11 and the supporting member 403 is sealed. Preferably the lead 111 is solder connected to the pin 91 and the lead 112 is solder connected to the pin 92 and the respective solder connecting portions are covered with a silicon adhesive agent.

Figure 1:
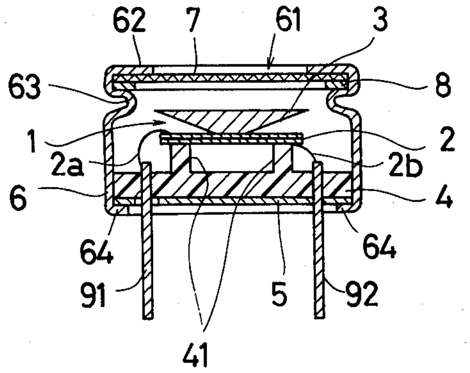
FIG.1 PRIOR ART
FIG. 1 is a sectional view showing an example of a conventional ultrasonic transducer.

According to the FIG. 11 embodiment, the screen member 7 is sandwiched between the protuberance 406 formed at the opening end of the peripheral wall 401 of the base 40*a* and the metallic casing 6. More specifically, the screen member 7 is disposed such that the same covers the opening end of the protuberance 406 while the periphery 71 thereof is brought to the outer side surface of the protuberance 406 and then the metallic casing 6 is put thereon, whereby the screen member 7 is fixed. Accordingly, in fixing the screen member 7, a complicated process as conventionally required as shown in FIG. 1 can be dispensed with, with the result that fixing thereof is considerably simplified.

Meanwhile, it is important that the diameter of the cylindrical post protrusion 122 of the resin resonator 12*a* is selected to be substantially the same as or slightly smaller than that of the nodal line of vibration of the bending vibration mode of the composite vibrator 10*a* and particularly not to exceed outward the nodal line. More specifically, although the cylindrical post protrusion 122 serves to decrease the quality factor of the resonance in the bending vibration mode by virtue of the mass of the protrusion 122, the protrusion 122 only slightly affects vibration in the piston vibration mode, inasmuch as the diameter of the protrusion 122 is substantially the same as or smaller than the diameter of the nodal line of the bending vibration mode, as described previously. Accordingly, although bending mode vibration is suppressed, total vibration of substantially the same degree can be caused as compared with the case where no cylindrical post protrusion is provided on the additional resonator 12, whereby piston mode vibration is relatively enhanced by suppression of bending mode vibration.

Although the protrusion 122 may be preferably formed integrally with the main body 121, alternatively the protrusion 122 may be formed as a separate portion and fixed to the main body 121 by means of an adhesive agent or the like. The geometry of the protrusion 122 is not limited to a cylindrical post as shown but alternatively the protrusion 122 may be configured as a hemisphere, or as a polygonal post. The mass of the protrusion 122 must be selected to properly decrease the quality factor at the second resonance, i.e. the a bending vibration mode resonance, and too small a quality factor decreases the sensitivity of the transducer. Accordingly, preferably the mass of the protrusion 122 is selected such that the sensitivity exceeds a practically utilizable level while vibration in the piston vibration mode is little influenced.

Since the composite vibrator 10*a* is also supported through the ring shaped elastic member 101' in the FIG. 11 embodiment as well, the efficiency of the first resonance region in the piston vibration mode is enhanced, with the result that an ultrasonic transducer of a good sensitivity over a broad band is provided. Since the protrusion 122 is formed of the main body 121 of the resin resonator 12*a*, the quality factor of the second resonance region can be decreased.

Figure 14:
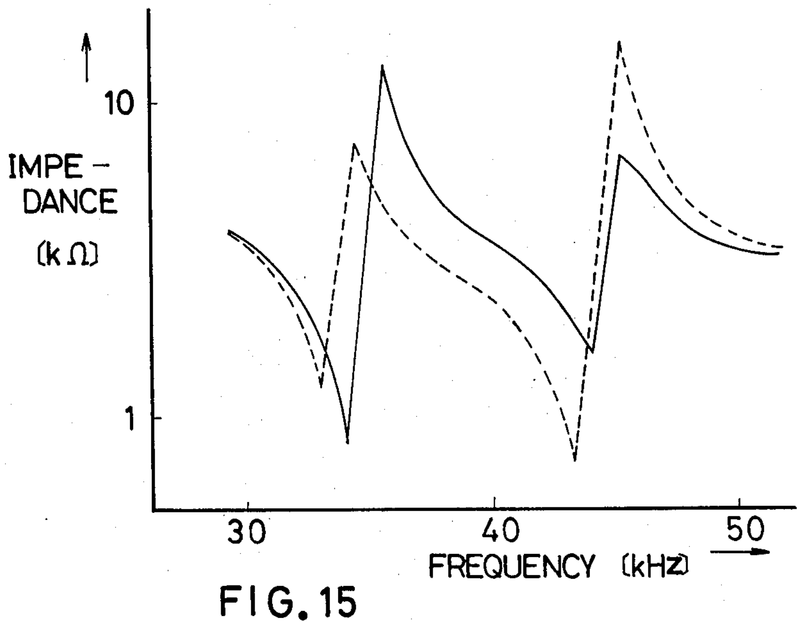
FIG. 14 is a graph showing an impedance characteristic typical of the FIG. 11 embodiment.
Figure 15:
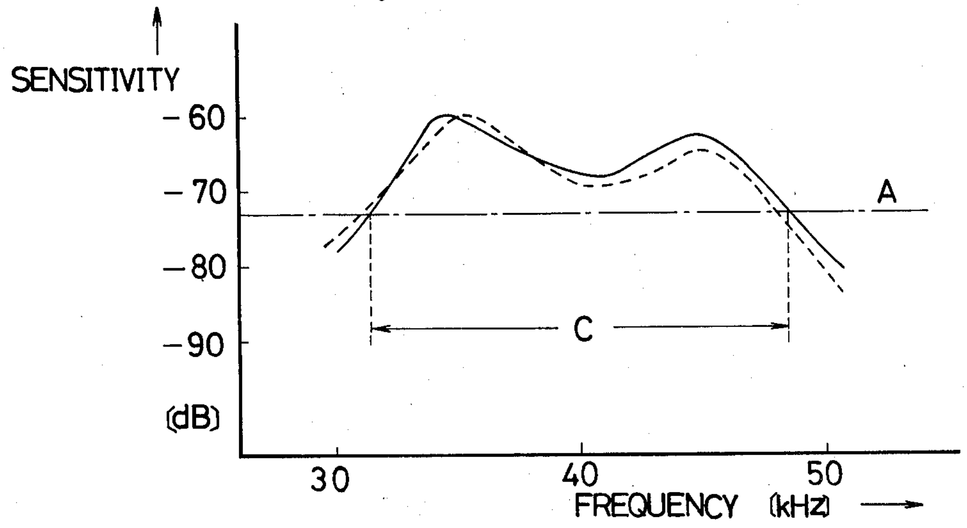
FIG. 15 is a graph showing a sensitivity characteristic typical of the FIG. 11 embodiment.

The curves as shown by the solid line and the dotted line in FIGS. 14 and 15 show changes of the impedance and sensitivity characteristics due to formation of the protrusion 122 in the additional resonator 12, wherein the dotted line shows characteristics of the transducer without the protrusion 122 in the additional resonator 12, whereas the solid line shows the characteristics of the inventive transducer with the protrusion 122 in the additional resonator 12*a*. As is clear from the dotted line of the figures, the quality factor of the second resonance is large and the second sensitivity is relatively small in the absence of the protrusion 122 in the additional resonator 12. By contrast, with the protrusion 122 formed in the additional resonator 12*a*, the quality factor in the first resonance region becomes large and the quality factor in the second resonance region becomes small, as shown by the solid lines. The reason is presumably that the quality factor in the second resonance region is suppressed by the protrusion 122, whereby the quality factor of the first resonance region in the piston vibration mode is increased in accord with the above described suppression. Referring to the FIG. 15 sensitivity characteristic, it is seen that the high-frequency sensitivity is increased with a decrease of the quality factor in the second resonance region. On the other hand, the low-frequency sensitivity is not decreased in spite of an increase of the quality factor in the first resonance region. The reason is presumably that the first resonance is caused by a piston vibration mode.

Meanwhile, if and when an offset is formed on the inner surface of the peripheral wall 401 of the insulating base 40*a* toward the open end thereof, as done in the embodiment shown in FIG. 11, then the transducing efficiency can be further enhanced. More specifically, formation of such offset serves to reflect an ultrasonic wave, so that on emission an ultrasonic wave converges toward the opening 61 of the casing 6, whereas an ultrasonic wave received from the environment converges toward the transducing surface of the additional resonator 12. Generally, such offset is difficult to form in case of a metallic casing, as shown in FIG. 1; however, it is very simple to form such offset, if and when a base is made of a resin material and formed as a bottomed cylindrical shape.

Now changes of the sensitivity level of a transducer when a base is configured in various ways will be described by showing the experimental data, thereby to substantiate how the base configuration in accordance with the embodiment shown brings about a preferred result.

Figure 16:
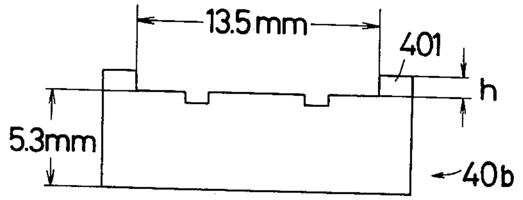
FIGS. 16 to 19 are sectional views of different examples of a base showing the dimensions thereof.
Figure 17:
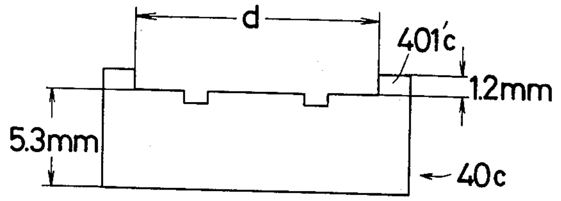
Figure 20:
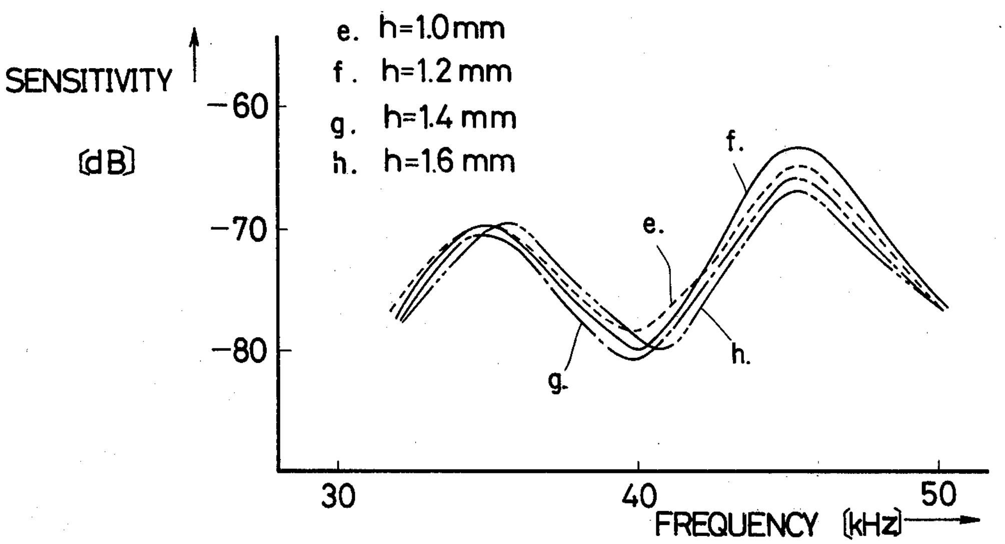
FIGS. 20 to 23 are graphs showing the sensitivity characteristic with the bases having the dimensions shown in FIGS. 16 to 19, respectively.
Figure 21:
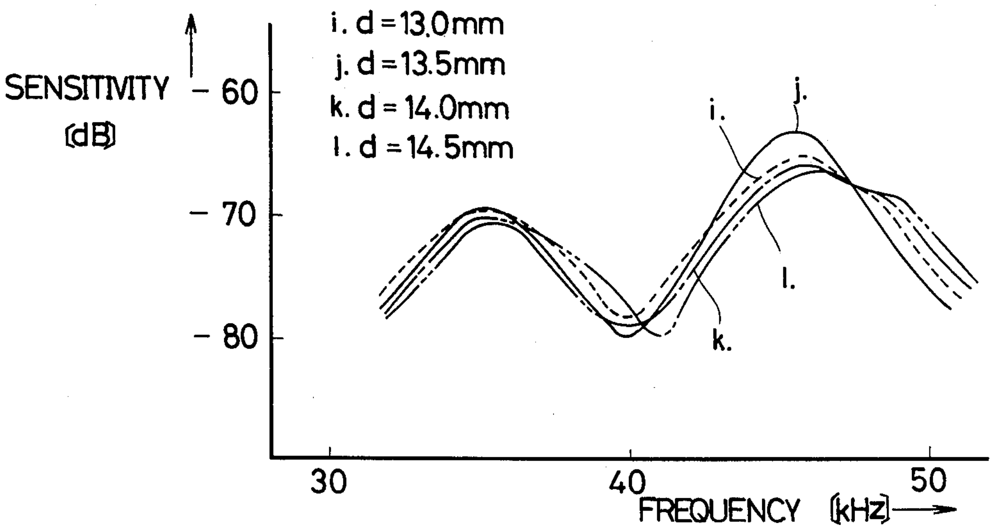

Experimentation was made using four different configurations of the base, as shown in FIGS. 16 to 19, with the base housed within the metallic casing 6. FIG. 16 shows a base 40*b* having a structure wherein a ring shaped protuberance 401 is formed on the base 40*b*, a composite vibrator being fixed at the center of the protrusion 404 through an elastic member, which is most typically considered to enhance the sensitivity. Experimentation was made by changing the height h' of the protuberance 401' and the result is shown in FIG. 20. As seen from FIG. 20, the sensitivity in the vicinity of the frequency 40 KHz is relatively small and is little enhanced even if the height h' is changed. Nevertheless, considering the whole range of the desired band, it may be said that a sensitivity becomes the maximum in the case where h'=1.2 mm. FIG. 17 shows another base 40*a* of a structure similar to the FIG. 16 base 40*b* but of a different inner diameter d of the protuberance 401' and the sensitivity characteristic obtained by experiment is shown in FIG. 21. As seen from FIG. 21, the sensitivity in the vicinity of the frequency 40 KHz is little enhanced even if the inner diameter d' of the protuberance 401' is changed, as in case where the height h is changed. Considering the whole range of a desired frequency band, the most preferred sensitivity is achieved in case where d'=13.5 mm.

Figure 18:
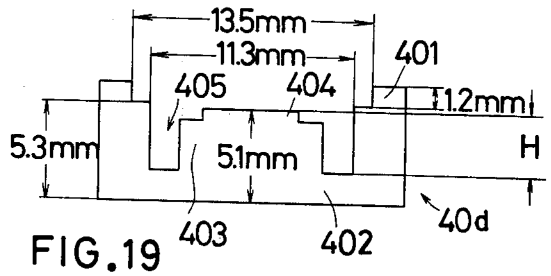
Figure 19:
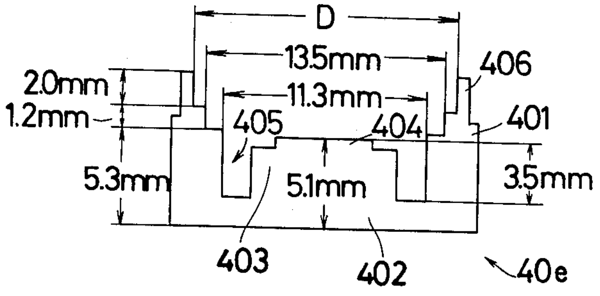
Figure 22:
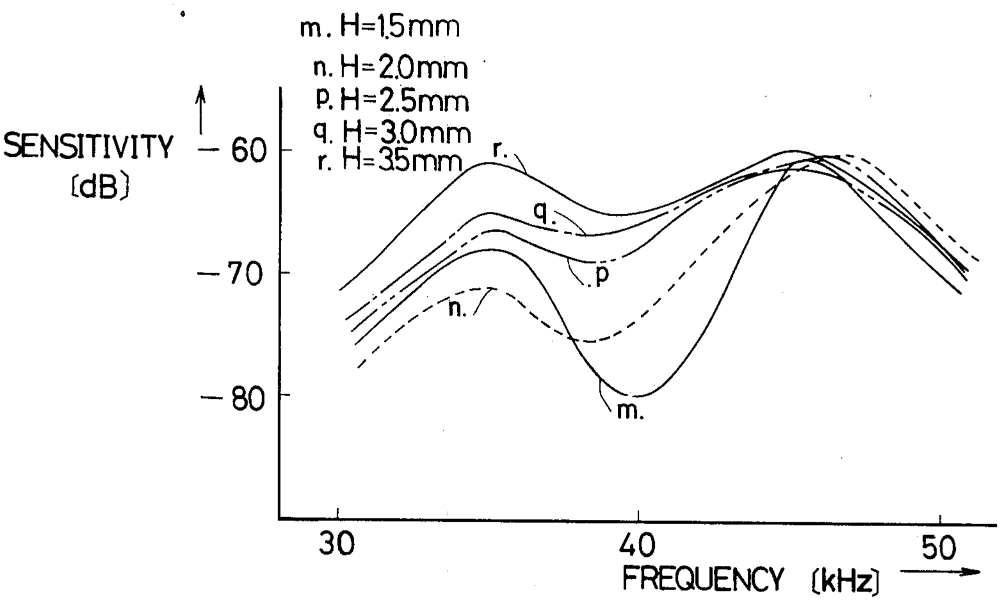
Figure 23:
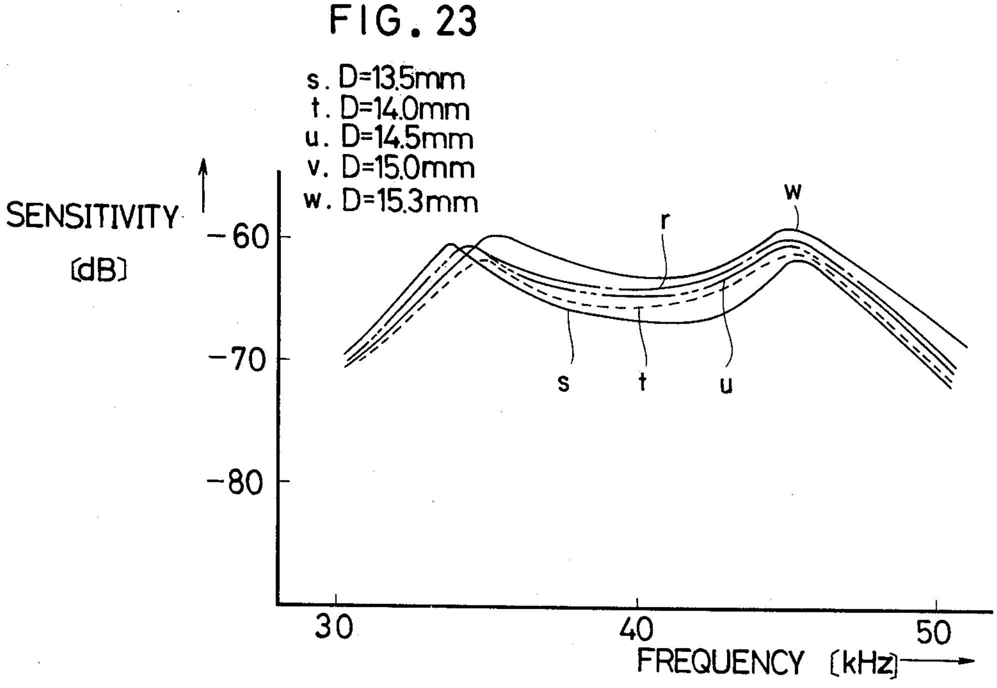

FIGS. 18 and 19 show different configurations of the base, i.e. a configuration of a bottomed cylindrical base having a supporting member, structured in accordance with a preferred embodiment of the present invention. Experimentation was made using the FIG. 18 base 40*d* by changing the depth H of the peripheral groove 405 formed between the peripheral wall 401 and the supporting member 403 and the result is shown in FIG. 22. As seen from FIG. 22, the sensitivity in the vicinity of 40 KHz is enhanced, while the sensitivity in the lower frequency region is also more or less enhanced, as the depth H of the peripheral groove 405 is increased. FIG. 19 shows a base 40*e* having a protuberance 406 elongated toward the open end of the peripheral wall, 401 and experimentation was made using the same by changing the inner diameter D of the protuberance 406. The result is shown in FIG. 23. As seen from FIG. 23, the sensitivity in the vicinity of the frequency 40 KHz is enhanced, while the sensitivity is improved throughout the broad band, as the inner diameter D is increased. As is clear from the above described experimental result, employment of a bottomed cylindrical base 40*d*, 40*e* as shown in FIGS. 18 and 19 enhances the sensitivity throughout the broad band as compared with the base 40*b*, 40*c* as shown in FIGS. 16 and 17. Thus, an optimum configuration of a bottomed cylindrical base can be determined based on experimentation as described in the foregoing.

Although the present invention has been described and illustrated in detail, it is to be understood that the same is by way of illustration and example only and is not to be taken by way of limitation, the spirit and scope of the present invention being limited only by the terms of the appended claims.

What is claimed is:

1. An ultrasonic transducer, comprising:

a composite vibrator including a piezoelectric bimorph vibrator and a resin resonator mounted on said bimorph vibrator, said composite vibrator having a first resonance region located in a first frequency range in which said composite vibrator vibrates in a piston vibration mode and a second resonance region located in a second frequency range, higher than said first frequency range, in which said composite vibrator vibrates in a bending vibration mode, said resin and resonator including a protrusion formed on the transducing surface thereof;

an insulating base on which said composite vibrator is mounted, said insulating base including a protruding portion; and an elastic member interposed between said bimorph vibrator and said insulating base, said elastic member being formed in a ring shape and having a thickness larger than the height of said protruding portion of said insulating base, said protruding portion of said insulating base having an outer diameter slightly smaller than the inner diameter of said ring-shaped elastic member, said ring-shaped elastic member being fitted on said protruding portion of said insulating base such that said elastic member extends above said protruding portion and said bimorph vibrator of said composite vibrator is mounted on said elastic member.

2. An ultrasonic transducer according to claim 1, wherein said ring-shaped elastic member is formed of a split portion.

3. An ultrasonic transducer in accordance with claim 1, wherein an external connection terminal is provided on said insulating base, a lead is provided for electrically connecting said bimorph vibrator and said external connection terminal, and an electrical junction of said lead to said bimorph vibrator is disposed in said split portion of said ring shaped elastic member.

4. An ultrasonic transducer in accordance with claim 3, wherein said elastic member is made of a silicon adhesive agent.

5. An ultrasonic transducer in accordance with claim 4, wherein said elastic member is made of silicon rubber.

6. An ultrasonic transducer, comprising:

a composite vibrator including a piezoelectric bimorph vibrator and a resin resonator mounted on said bimorph vibrator, said composite vibrator having a first resonance region located in a first frequency range in which said composite vibrator vibrates in a piston vibration mode and a second resonance region located in a second frequency range, higher than said first frequency range, in which said composite vibrator vibrates in a bending vibration mode, said resin and resonator including a protrusion formed on the transducing surface thereof, said protrusion taking the form of a cylindrical post and having a diameter substantially equal to the diameter of the fundamental nodal line circle of said second resonance region of said composite vibrator;

an insulating base on which said composite vibrator is mounted; and an elastic member interposed between said bimorph vibrator and said insulating base.

7. An ultrasonic transducer in accordance with claim 6, wherein:

said insulating base has a cylindrical support member formed therein; and said composite vibrator is mounted on said cylindrical support member through said elastic member.

8. An ultrasonic transducer in accordance with claim 7, wherein said insulating base has an opening end and further includes a peripheral wall surrounding said cylindrical support member, the inner diameter of said peripheral wall increasing in the direction of said opening end, whereby an ultrasonic wave is converged from or to the transducing surface of said composite vibrator.

9. An ultrasonic transducer in accordance with claim 8, wherein:

said cylindrical support member further includes a peripheral groove formed therein; and said composite vibrator is mounted to said cylindrical supporting member through said elastic member which is situated in said peripheral groove.

10. An ultrasonic transducer in accordance with claim 9, wherein:

said insulating base is housed in a metallic casing;

said metallic casing has an opening facing said transducing surface of said composite vibrator; and a screen member covers said opening of said metallic casing.

11. An ultrasonic transducer in accordance with claim 10, wherein said screen member is sandwiched between an end of said peripheral wall of said insulating base and said metallic casing.

* * * * *